United States Patent
Shah et al.

(10) Patent No.: US 7,745,270 B2
(45) Date of Patent: Jun. 29, 2010

(54) TRI-GATE PATTERNING USING DUAL LAYER GATE STACK

(75) Inventors: Uday Shah, Portland, OR (US); Brian S. Doyle, Portland, OR (US); Jack T. Kavalieros, Portland, OR (US); Been-Yih Jin, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 12/006,047

(22) Filed: Dec. 28, 2007

(65) Prior Publication Data
US 2009/0170267 A1 Jul. 2, 2009

(51) Int. Cl.
*H01L 21/84* (2006.01)
(52) U.S. Cl. ............... 438/157; 438/283; 257/E21.409
(58) Field of Classification Search .......... 438/283, 438/157, 199, 197; 257/E21.409, 369, E21.632
See application file for complete search history.

(56) References Cited

U.S. PATENT DOCUMENTS 7,314,789 B2 * 1/2008 Cabral et al. ............... 438/197
7,358,121 B2 * 4/2008 Chau et al. ................. 438/149
7,528,025 B2 * 5/2009 Brask et al. ................ 438/183

* cited by examiner

*Primary Examiner*—Davienne Monbleau
*Assistant Examiner*—Shweta Mulcare
(74) *Attorney, Agent, or Firm*—Ryder, Lu, Mazzeo and Konieczny, LLC; Douglas J. Ryder (57) ABSTRACT

In general, in one aspect, a method includes forming an n-diffusion fin and a p-diffusion fin in a semiconductor substrate. A high dielectric constant layer is formed over the substrate. A first work function metal layer is created over the n-diffusion fin and a second work function metal layer, thicker than the first, is created over the n-diffusion fin. A silicon germanium layer is formed over the first and second work function metal layers. A polysilicon layer is formed over the silicon germanium layer and is polished. The polysilicon layer over the first work function metal layer is thicker than the polysilicon layer over the second work function metal layer. A hard mask is patterned and used to etch the polysilicon layer and the silicon germanium layer to create gate stacks. The etch rate of the silicon germanium layer is faster over the first work function metal layer.

20 Claims, 9 Drawing Sheets

FIG. 11B

# TRI-GATE PATTERNING USING DUAL LAYER GATE STACK

BACKGROUND

The etching rate of conductive material (e.g., polysilicon) over different p-diffusion and n-diffusion work metals is inherently different. When forming gate stacks this different etching rate results in over etching and exposure of the underlying metal for certain gate stacks and gate stacks that are notched and have flared profile. As semiconductor devices continue to be scaled to smaller dimensions even small amounts of notched or flared gate profiles will significantly hinder device performance.

BRIEF DESCRIPTION OF THE DRAWINGS

The features and advantages of the various embodiments will become apparent from the following detailed description in which.

DETAILED DESCRIPTION

In order to reduce or eliminate the effect of differential etch rates on formation of gate stacks, gate stacks may be formed from more than one material where the thicknesses of the materials are selected to account for the different etch rates. Materials having superior and desirable etch qualities may be used for one of the layers to provide more vertically aligned gate profiles.

Figure 1:
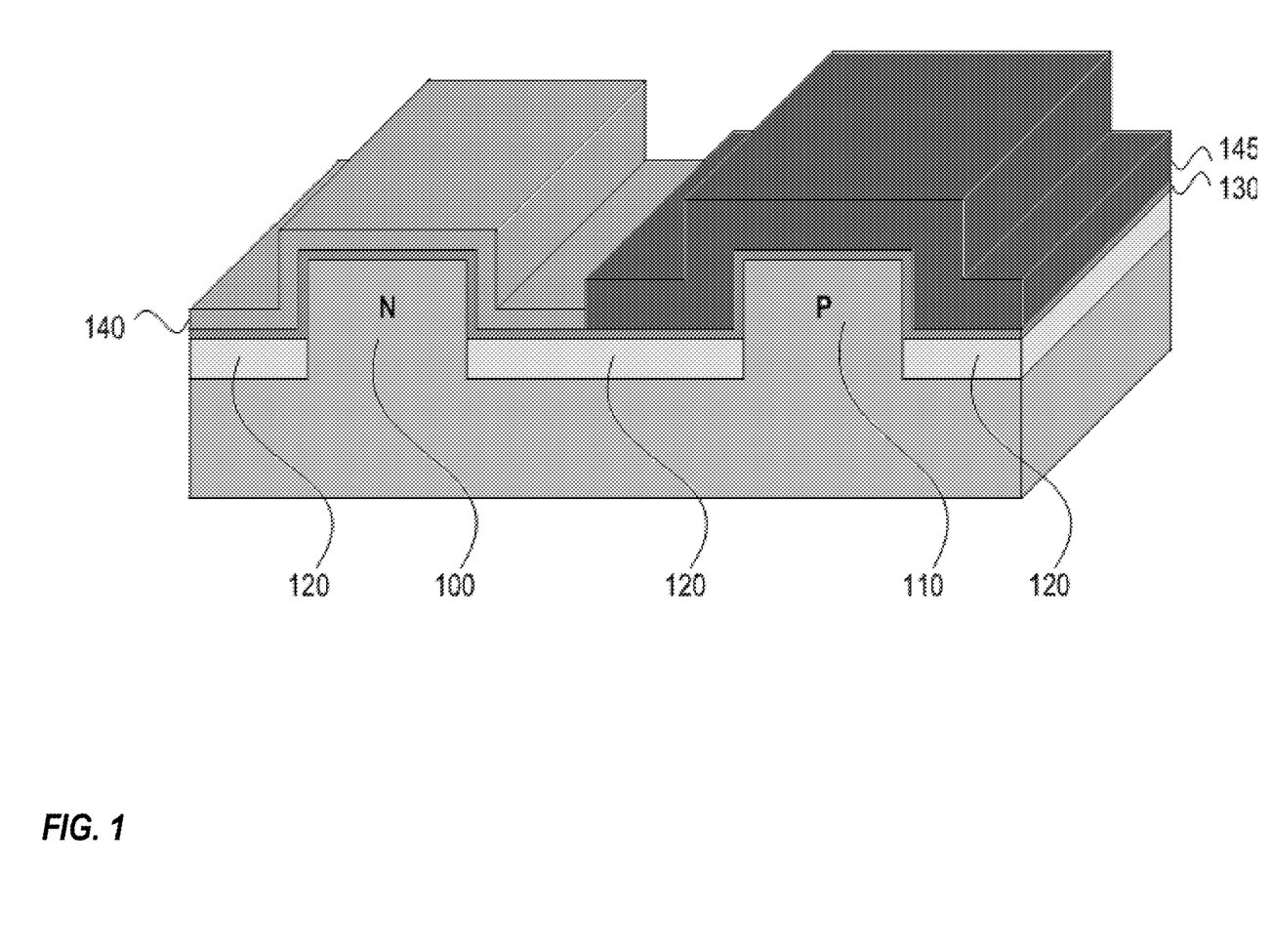
FIG. 1 illustrates an example substrate having N and P transistor regions formed therein, according to one embodiment.

FIG. 1 illustrates an example substrate having N and P transistor regions formed therein. The substrate (e.g., silicon) includes fins 100, 110 formed therein separated by an electrically insulating layer 120 (e.g., oxide) to provide shallow trench isolation (STI). The fin 100 may be an n-diffusion fin and the fin 110 may be a p-diffusion fin. A dielectric layer (e.g., oxide, nitride, high dielectric constant (K) material) 130 is formed on the substrate (fins 100, 110 and insulating layer 120). A conductive gate layer (e.g., metal) is created on the dielectric layer 130. The metal gate layer may include an n-type metal gate layer 140 over the n-diffusion fin 100 and p-type metal gate layer 145 over the over the p-diffusion fin 110. The n-type metal gate layer 140 and the p-type metal gate layer 145 may have different thicknesses (e.g., p-type metal gate layer 145 thicker). The metal gate layers 140, 145 may be formed of different materials or one layer (e.g., p-type metal gate layer 145) may include an additional layer (e.g., material) on top of an initial layer. The diffusion fins 100, 110 and the various layers 120, 130, 140, 145 may be formed through any number of known processes.

Figure 2:
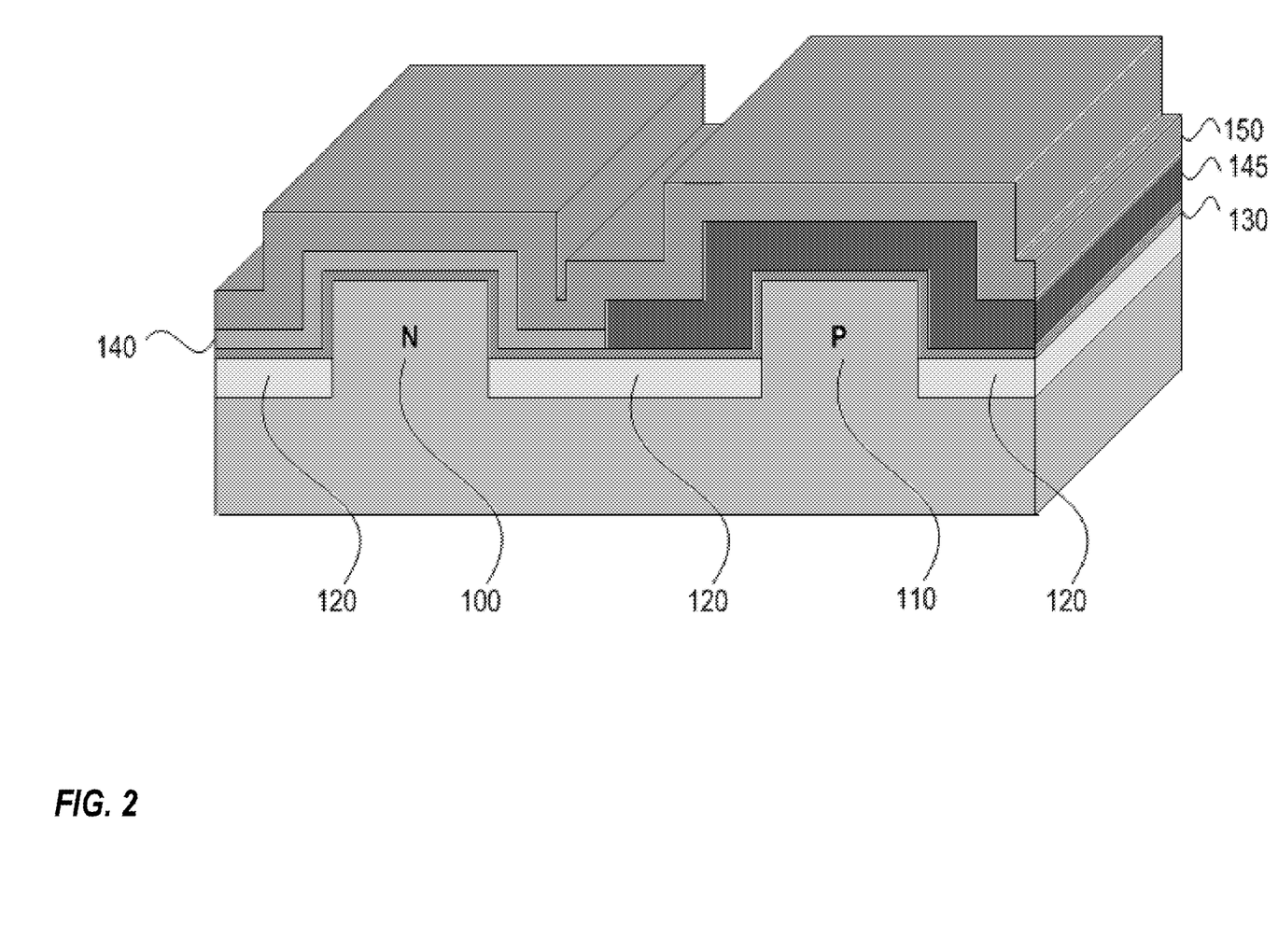
FIG. 2 illustrates the example substrate after a first gate stack layer is formed on the gate conducting layers, according to one embodiment.

FIG. 2 illustrates the example substrate after a first gate stack layer (e.g., Si—Ge) 150 is formed on the metal gate layers 140, 145. The first gate stack layer 150 may be formed through any number of known processes.

Figure 3:
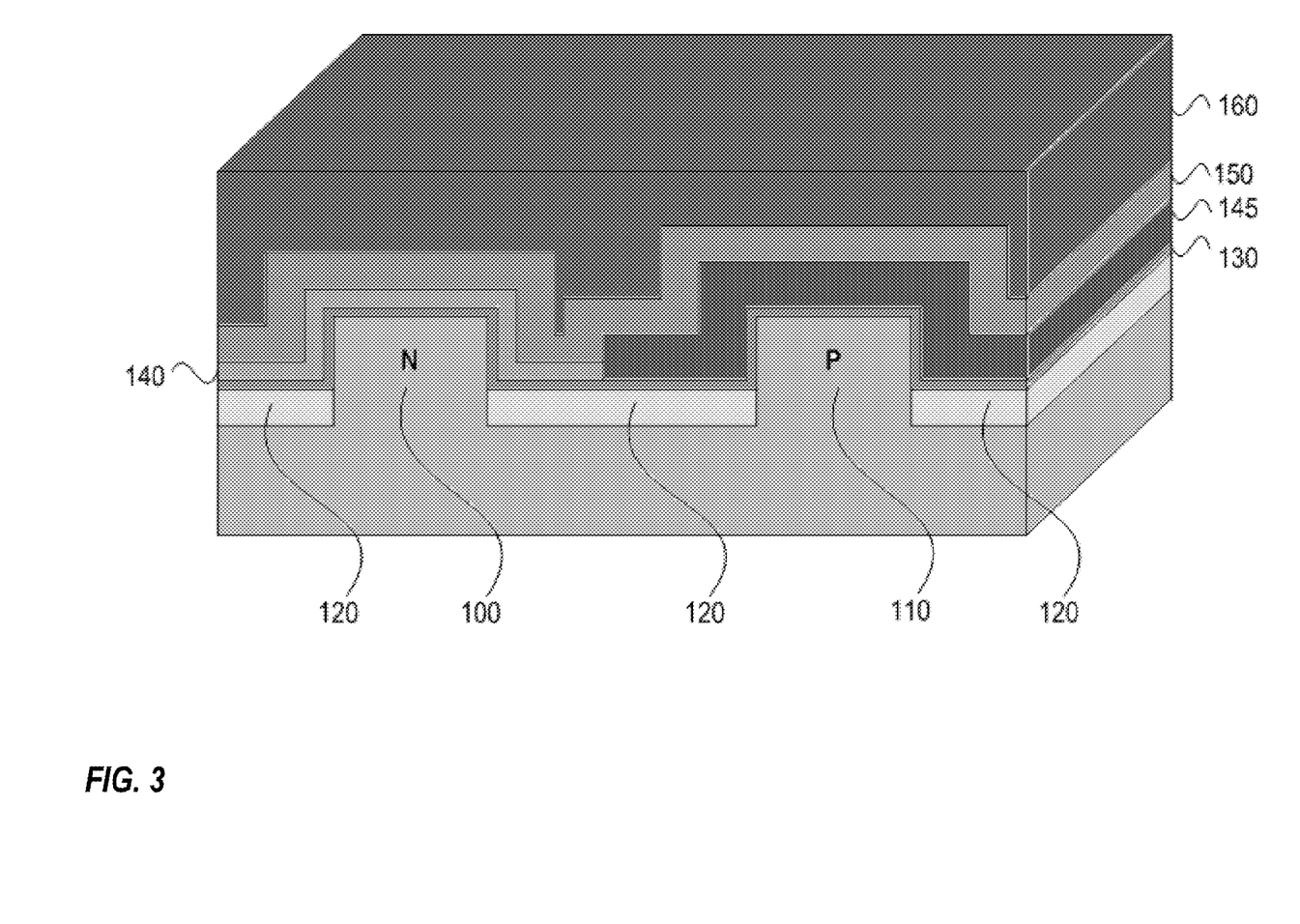
FIG. 3 illustrates the example substrate after a second gate stack layer is formed on the first gate stack layer and is polished, according to one embodiment.

FIG. 3 illustrates the example substrate after a second gate stack layer (e.g., polysilicon) 160 is formed on the first gate stack layer 150 and is polished. The second gate stack layer 160 may be formed having a substantial thickness to ensure that after polishing the top surface is flat (planarized). After polishing the thickness of the second gate stack layer 160 is different over the metal gate layers 140, 145 (e.g., thicker over the n-type metal gate layer 140). The second gate stack layer 160 may be formed and polished through any number of known processes.

The thicknesses of the first gate stack layer 150 is selected to account for the different etch rates of the first gate stack layer 150 over the n-type metal gate layer 140 (n-diffusion fin 100) and the p-type metal gate layer 145 (p-diffusion fin 110), the difference in the thickness of the metal gate layers 140, 145 which impacts the difference in the thickness of the second gate stack layer 160 over the n-type metal gate layer 140 and the p-type metal gate layer 145, and the etch rate of the second gate stack layer 160. The thickness of the second gate stack layer 160 is selected based on the thickness of the first gate stack layer 150 and the desired thickness of the gate stacks.

The difference in thickness of the metal gate layers 140, 145 and the thickness of the first gate stack layer 150 can be selected to dictate the relative exposure of the metal gate layers 140, 145. The etching of the gate stack layers 150, 160 and exposure of the metal gate layers 140, 145 should ideally complete at the same (or substantially the same) time so over etching of a metal gate layer (e.g., n-type metal gate layer 140) and exposure of the insulating layer 130 doesn't occur.

Figure 4:
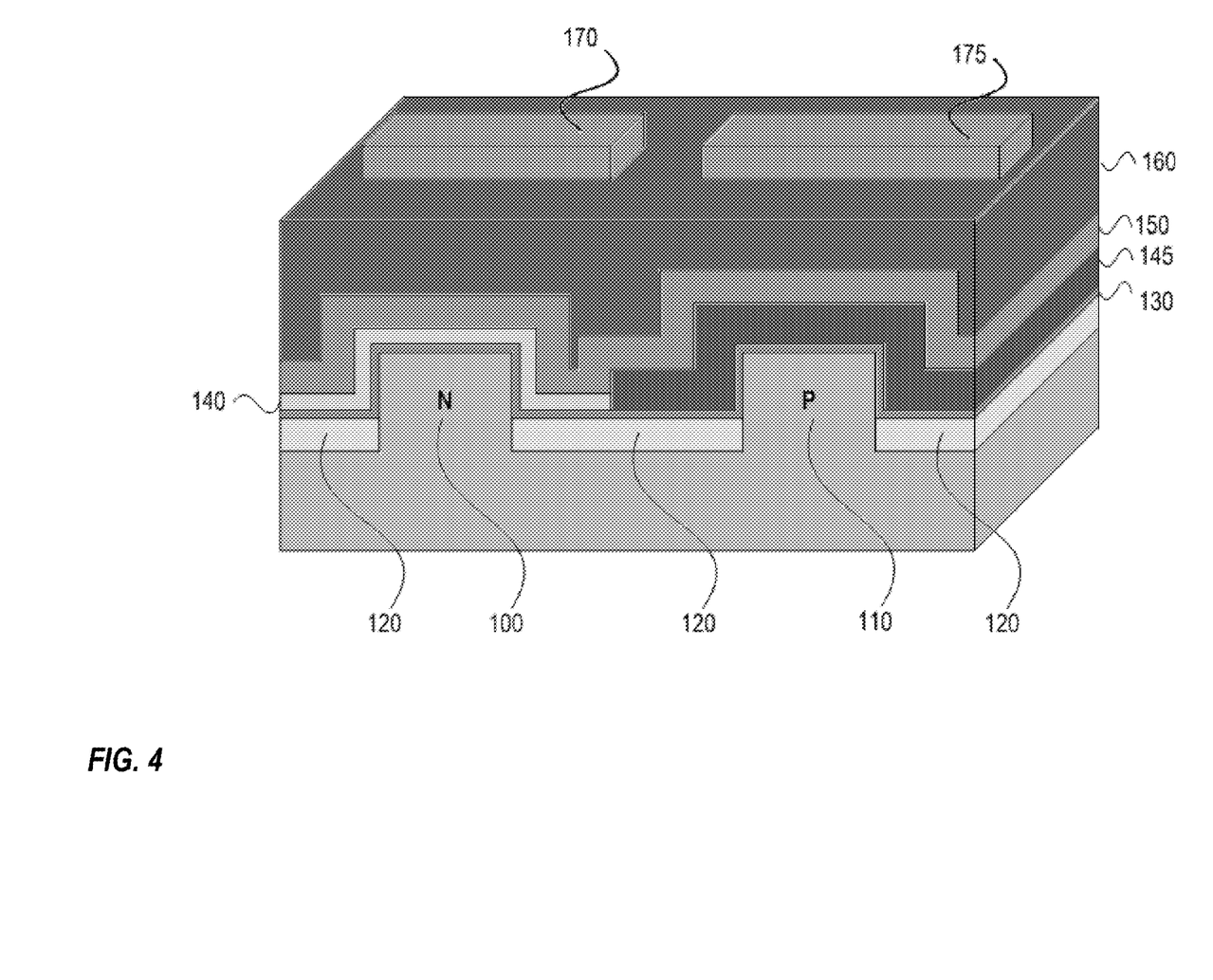
FIG. 4 illustrates the example substrate after a hard mask is formed and patterned over the diffusion fins, according to one embodiment.

FIG. 4 illustrates the example substrate after a hard mask n-type gate pattern 170 and a hard mask p-type gate pattern 175 is formed and patterned over the diffusion fins 100, 110 respectively. The hard mask gate patterns 170, 175 may be patterned through any number of known processes. For example, a resist layer may be patterned (e.g., lithography) over a hard mask layer and the hard mask layer may be etched using the resist pattern and then the resist layer may be removed.

Figure 5:
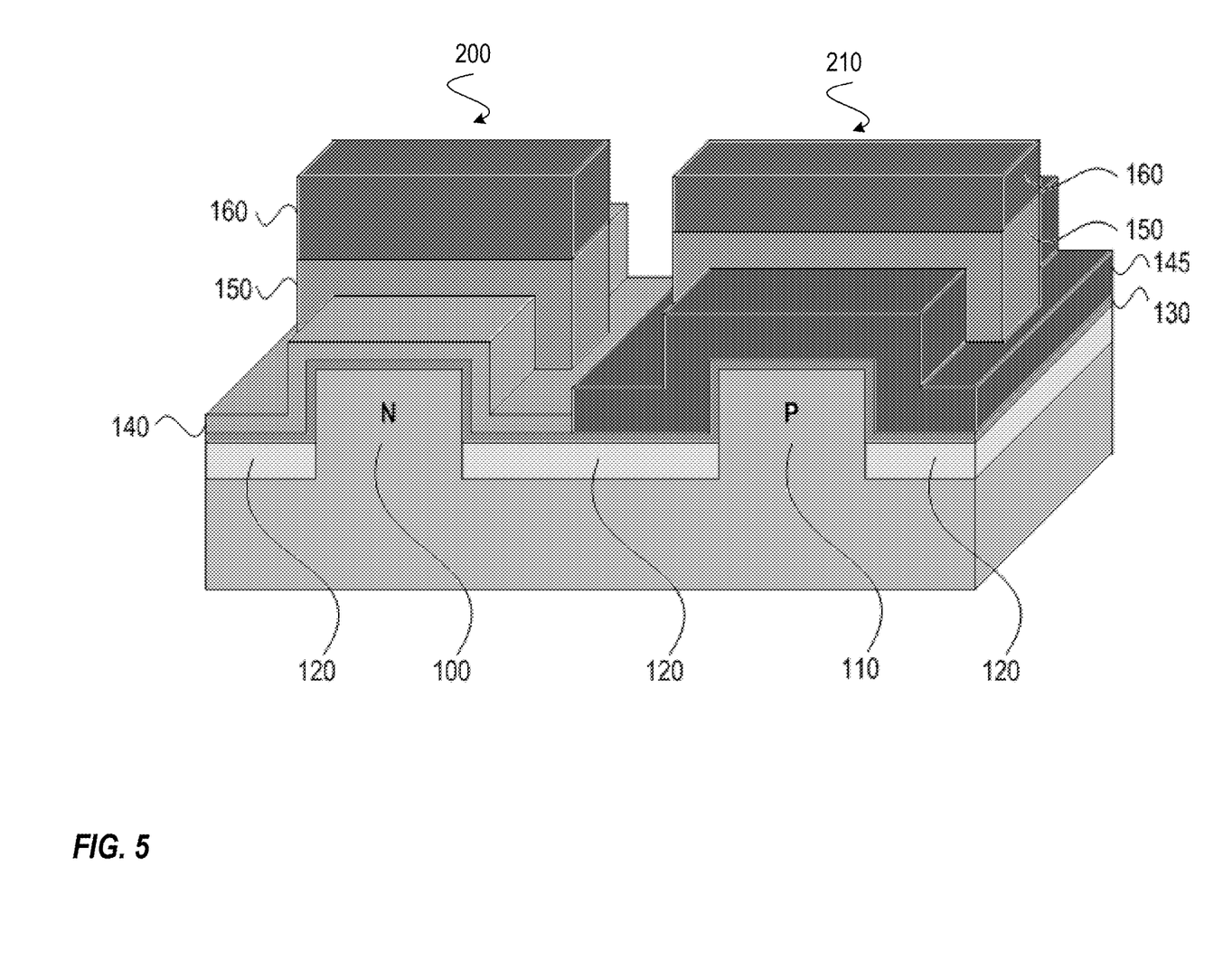
FIG. 5 illustrates the example substrate after the gate stack layers are etched to create gate stacks, according to one embodiment.

FIG. 5 illustrates the example substrate after the gate stack layers 150, 160 are etched to create an n-type gate stack 200 over the n-type metal gate layer 140 and a p-type gate stack 210 over the p-type metal gate layer 145. The overall height that the gate stacks 200, 210 protrude from the substrate is the same (or substantially the same) while the thicknesses of the gate stacks is different (e.g., gate stack 200 is thicker). The first gate stack layer 150 has the same (or substantially the same) thickness in the two gate stacks 200, 210 while the second gate stack layer 160 has a different thickness in the two gate stacks 200, 210. The gate stack layers 150, 160 may be etched through any number of known processes.

As the thicknesses of the second gate stack layer 160 are different over the different metal gate layers 140, 145 and the etch rates are the same (or substantially the same), the etching of a first portion (e.g., over the P-type metal layer 145) of the second gate stack layer 160 will complete prior to a second portion (e.g., over the n-type metal layer 140) the etching of the first gate stack layer 150 will begin earlier for the first portion. As the etch rates for the first gate stack layer 150 are different but the thicknesses are the same (or substantially the same), the etching of a first portion (over the n-type metal layer 140) of the first gate stack layer 160 will take less time than the etching of a second portion (e.g., over the P-type metal layer 145).

The overall etching of the gate stacks 200, 210 based on the thicknesses of the gate stack layers 150, 160 and the etching rates of the first gate stack layer 150 should complete at the same (or substantially the same) time so that the metal gate layers 140, 145 are exposed at relatively the same time. The etch completion/metal gate layer 140, 145 exposure at the same time ensures that the metal gate layers 140, 145 are not over etched and the dielectric layer 130 is not exposed. Utilizing SiGe as the first gate layer 150 reduces charge induced notching and improves charge conductivity (relative to poly silicon) due to the inherent properties of the SiGe.

Figure 6A:
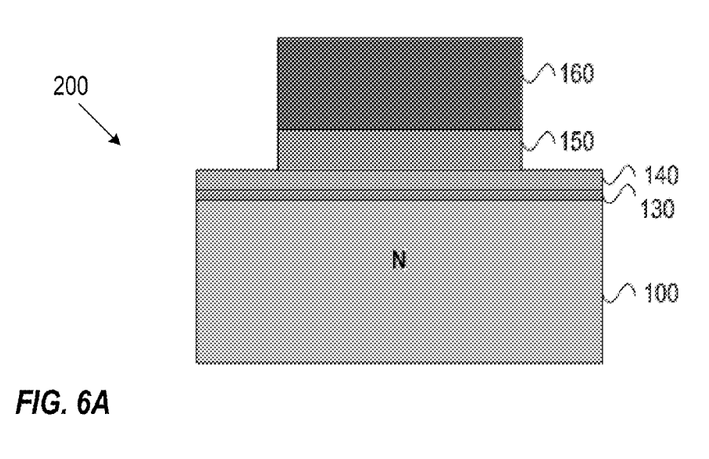
FIGS. 6A-B illustrate cross sectional views of the gate stacks of FIG. 5, according to one embodiment.
Figure 6B:
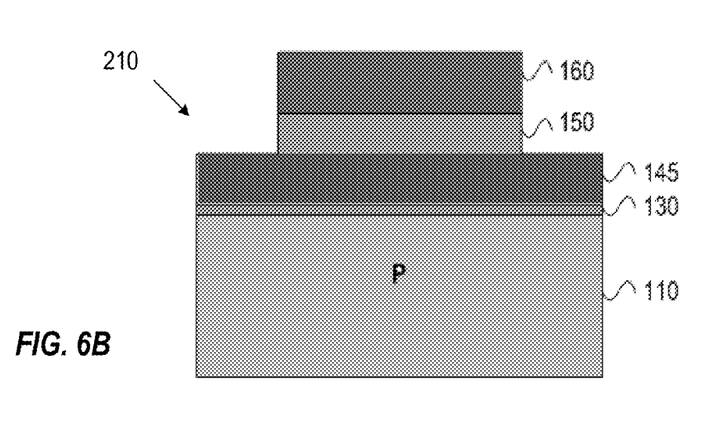

FIGS. 6A-B illustrate cross-sectional views through the gate stacks 200, 210 respectively. The n-type gate stack 200 includes the n-type fin 100, the n-type metal layer 140, the first gate stack layer 150 and the second gate stack layer 160. The p-type gate stack 210 includes the n-type fin 110, the p-type metal layer 145, the first gate stack layer 150 and the second gate stack layer 160. The p-type metal layer 145 is thicker than the n-type metal layer 140, the first gate stack layer 150 is the same thickness on each stack 200, 210 but has a relative height (height from top of substrate) that is higher for the p-type gate stack 210, the second gate stack layer 160 is thicker for the n-type gate stack 200, and the overall relative height of the gate stacks 200, 210 is the same.

FIGS. 5 and 6A-B illustrated gate electrodes 200, 210 being formed over each of the fins 100, 110 respectively. It is possible that a gate electrode will be formed that extends over more then one fin to create a device utilizing more than one transistor (e.g., SRAM cell).

Figure 7:
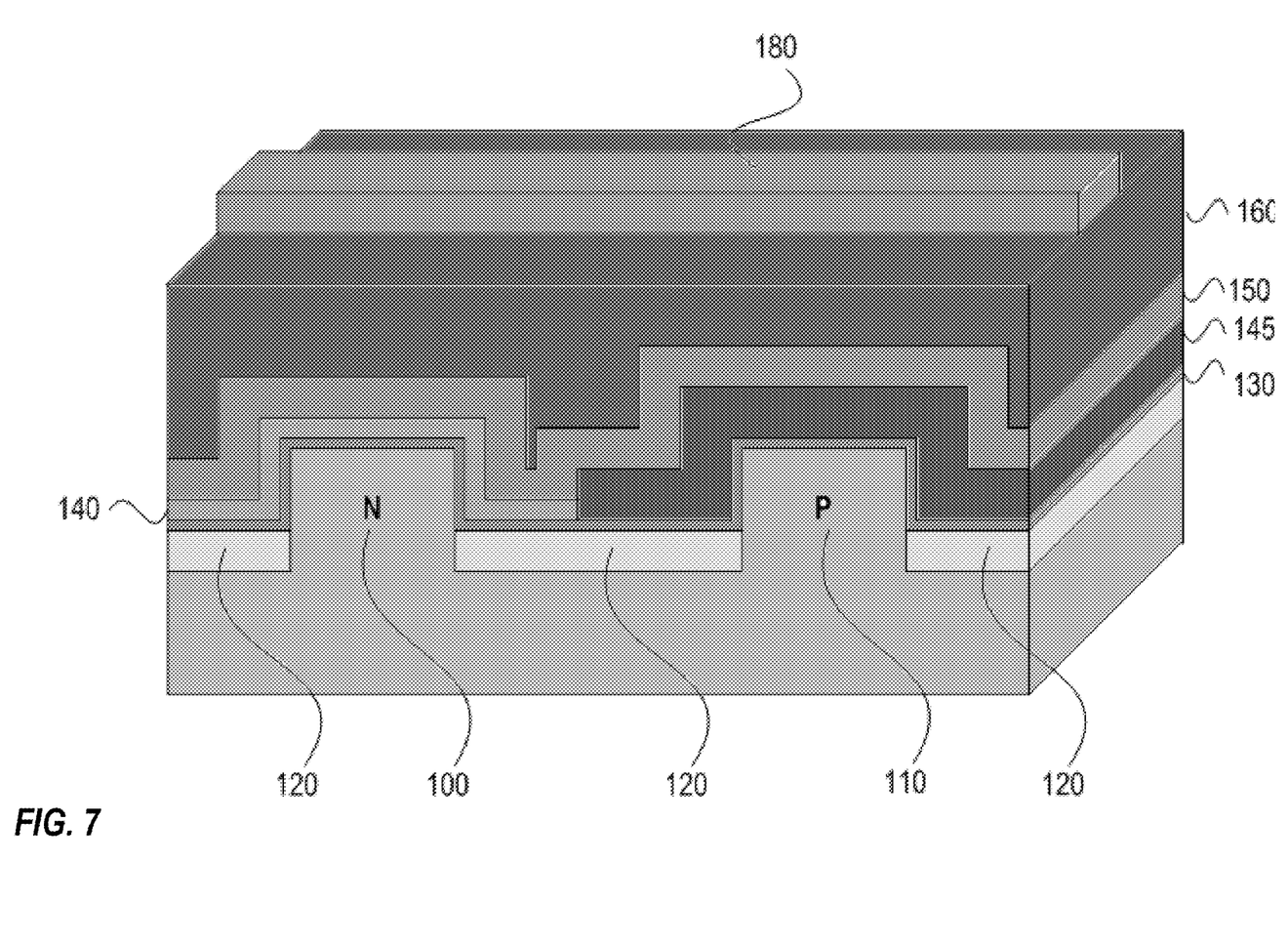
FIG. 7 illustrates the example substrate after a hard mask gate electrode pattern is formed and patterned that extends over the n-type metal gate layer and the p-type metal gate layer, according to one embodiment.

FIG. 7 illustrates the example substrate after a hard mask gate electrode pattern 180 is formed and patterned that extends over the diffusion fins 100, 110. The hard mask gate electrode pattern 180 may be patterned through any number of known processes.

Figure 8:
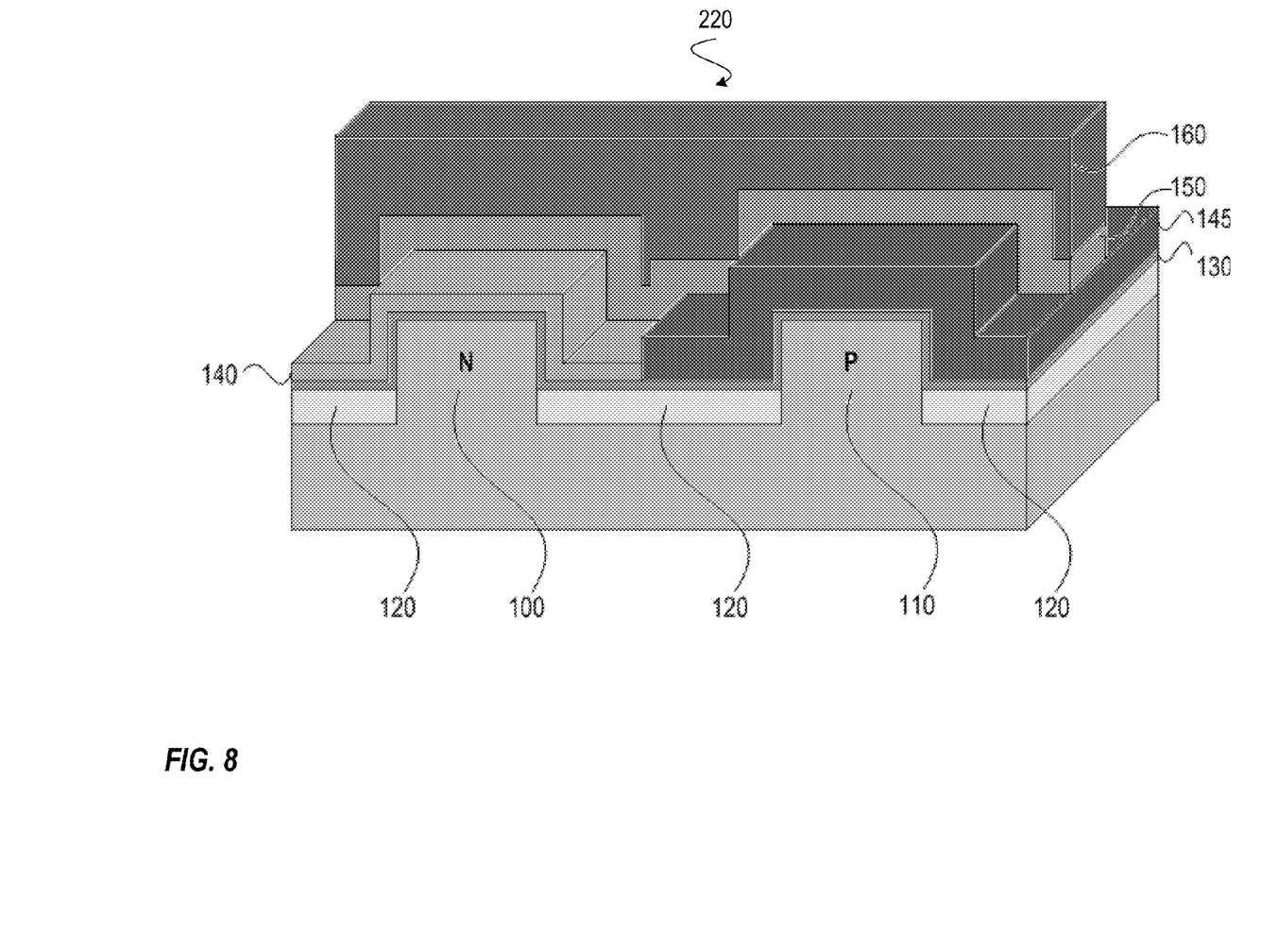
FIG. 8 illustrates the example substrate after the gate stack layers are etched to create a gate electrode, according to one embodiment.

FIG. 8 illustrates the example substrate after the gate stack layers 150, 160 are etched to create a gate electrode 220 that extends over the n-type metal gate layer 140 and the p-type metal gate layer 145.

Figure 9:
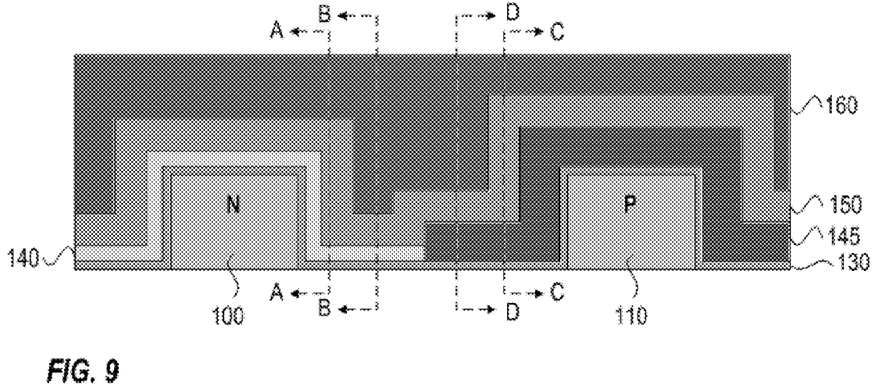
FIG. 9 illustrates a cross sectional view of the gate electrode of FIG. 8, according to one embodiment.

FIG. 9 illustrates a cross sectional view of the gate electrode 220. The cross sectional view more easily illustrates the relative heights and thicknesses of the various layers. The cross sectional view also includes marks indicating cross sectional views of the substrate that will be illustrated in FIGS. 10 and 11.

Figure 10A:
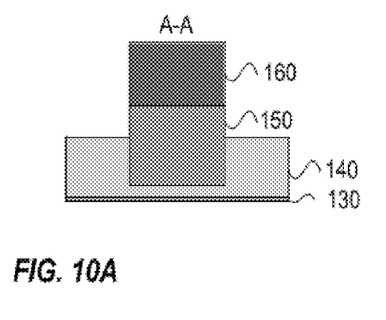
FIGS. 10A-B illustrate cross sectional views of the substrate from varying distances away from the n-type fin, according to one embodiment.
Figure 10B:
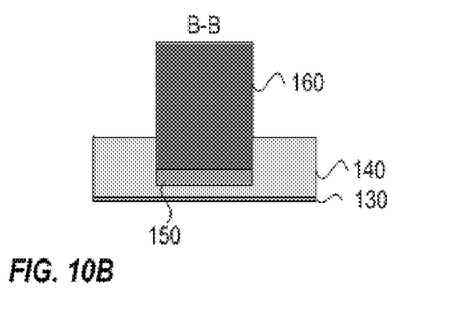

FIGS. 10A-B illustrate cross sectional views A-A and B-B respectively of the substrate from varying distances away from the fin 100. View A-A illustrates how the first gate layer (e.g., SiGe) 150 will extend above the fin 100. The use of SiGe provides better etching properties at the corners of the fin 100 to reduce notching and provide a vertical (or substantially vertical) gate stack at this critical point. View B-B illustrates how the first gate layer 150 is below the level of the fin as you proceed away from the fin 100.

Figure 11A:
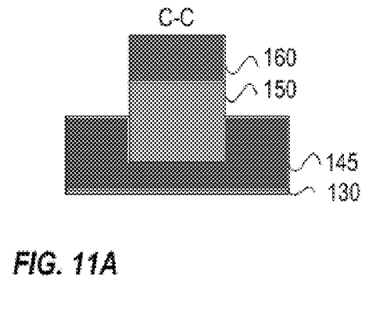
FIGS. 11A-B illustrate cross sectional views of the substrate from varying distances away from the p-type fin, according to one embodiment.
Figure 11B:
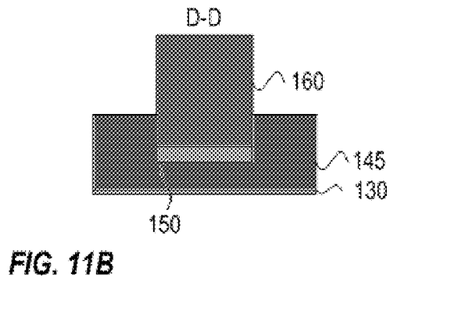

FIGS. 11A-B illustrate cross sectional views C-C and D-D respectively of the substrate from varying distances away from the fin 110.

While the embodiments described above focused on formation of dual layer gate stacks for non-planar transistors, it is not limited thereto. Rather, the dual layer gate stack could be utilized for planar transistors as well. Furthermore, the embodiments were described with respect to gate stacks having two layers but are not limited thereto. Rather, more than two layers can be used.

Moreover, the embodiments were described with respect to the gate stack having the same thickness first gate stack layer over the n and p type metal gate layers and different thickness second layers over the n and p type metal gate layers, but are not limited thereto. Rather, the first gate stack layer could be polished so the thickness is different over the n and p type metal gate layers with the overall thickness of the first gate stack layer determined based on the difference in the thickness of the metal gate stack layers and the difference in the etch rates of the first gate stack layer over the n and p type metal gate layers. The second gate stack layer could then be the same thickness over the n and p type metal gate layers with the thickness based on overall desired gate stack thickness.

If the etch rate delta of the first gate stack layer over the n and p type metal gate layers is not linear, then tuning the thickness alone may be insufficient to obtain a desired gate height and the addition of second gate stack layer may be imperative. Due to certain integration requirements the total stack height plays a very critical role in fabrication process, especially when the device pitch size (measure of spacing between adjacent structures) becomes smaller.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. A method comprising
   forming an n-diffusion fin and a p-diffusion fin in a semiconductor substrate;
   forming a dielectric layer over the substrate;
   creating a first conductive gate layer over the dielectric layer on the p-diffusion fin;
   creating a second conductive gate layer over the dielectric layer on the n-diffusion fin;
   forming a first gate stack layer over the first and second conductive gate layers;
   forming a second gate stack layer over the first gate stack layer;
   polishing the second gate stack layer;
   patterning a gate electrode hard mask; and
   etching the second gate stack layer and the first gate stack layer to create gate stacks over the n-diffusion fin and the p-diffusion fin, wherein the thickness of the first and second conductive gate layers and the first gate stack layer are selected to cause the etching to expose the first and the second conductive gate layers at substantially the same time.

2. The method of claim 1, wherein the first conductive gate layer and the second conductive gate layer have different thicknesses.

3. The method of claim 1, wherein the first conductive gate layer and the second conductive gate layer are made of different materials.

4. The method of claim 1, wherein the forming a dielectric layer includes forming a high dielectric constant layer.

5. The method of claim 1, wherein
the creating a first conductive gate layer includes creating a first work function metal layer; and
the creating a second conductive gate layer includes creating a second work function metal layer.

6. The method of claim 1, wherein the forming a first gate stack layer includes forming a silicon germanium layer.

7. The method of claim 1, wherein the forming a second gate stack layer includes forming a polysilicon layer.

8. The method of claim 1, wherein the etching includes etching the second gate stack layer at same rate over the n-diffusion fin and the p-diffusion fin and etching the first gate layer at different rates over the n-diffusion fin and the p-diffusion fin.

9. The method of claim 1, wherein the gate stacks are part of a gate electrode that extends across the n-diffusion fin and the p-diffusion fin.

10. A method comprising
forming an n-diffusion fin and a p-diffusion fin in a semiconductor substrate;
forming a high dielectric constant layer over the substrate;
creating a first work function metal layer over the high dielectric constant layer on the n-diffusion fin;
creating a second work function metal layer over the high dielectric constant layer on the p-diffusion fin, wherein the second work function metal layer is thicker than the first work function metal layer;
forming a silicon germanium layer over the first and second work function metal layers;
forming a ploysilicon layer over the silicon germanium layer;
polishing the ploysilicon layer, wherein the ploysilicon layer over the first work function metal layer is thicker than the ploysilicon layer over the second work function metal layer;
patterning a gate electrode hard mask; and
etching the ploysilicon layer and the silicon germanium layer to create gate stacks over the n-diffusion fin and the p-diffusion fin, wherein etch rate of the silicon germanium layer is faster over the first work function metal layer.

11. The method of claim 10, wherein thickness of the first and second work function metal layers and the silicon germanium layer are selected to dictate relative exposure of the first and second work function metal layers.

12. The method of claim 11, wherein the relative exposure time is substantially the same time for the first and second work function metal layers.

13. The method of claim 10, wherein thickness of the silicon germanium layer is selected to account for difference in thickness of the first and second work function metal layers and difference in etch rates of the silicon germanium layer over the first and second work function metal layers.

14. The method of claim 10, wherein the first and second work function metal layers are made of different materials.

15. The method of claim 10, wherein the gate stacks are part of a gate electrode that extends across the n-diffusion fin and the p-diffusion fin.

16. A method comprising
forming a semiconductor substrate having an n-diffusion fin and a p-diffusion fin;
forming a dielectric layer over the substrate;
forming an n-type metal layer over the dielectric layer on the n-diffusion fin;
forming a p-type metal layer over the dielectric layer on the p-diffusion fin, wherein the p-type metal layer is thicker than the n-type metal layer;
forming a silicon germanium layer over the n-type and p-type metal layers;
forming a ploysilicon layer over the silicon germanium layer;
polishing the ploysilicon layer to form a planarized top surface, wherein after the polishing the ploysilicon layer is thicker over the n-type metal layer than over the p-type metal layer;
patterning a gate electrode hard mask to define gate stacks over the n-diffusion fin and the p-diffusion fin; and
etching the ploysilicon layer and the silicon germanium layer to create the gate stacks over the n-diffusion fin and the p-diffusion fin, wherein the etching exposes the n-type metal layer and the p-type metal layer at substantially the same time.

17. The method of claim 16, wherein the n-type and p-type metal layers are made of different materials.

18. The method of claim 16, wherein the gate stacks are part of a gate electrode that extends across the n-diffusion fin and the p-diffusion fin.

19. The method of claim 16, wherein the forming a dielectric layer includes forming a high dielectric constant layer.

20. The method of claim 16, wherein the etching includes etching through the silicon germanium layer over the n-type metal layer at a faster rate than over the p-type metal layer.

* * * * *

UNITED STATES PATENT AND TRADEMARK OFFICE
CERTIFICATE OF CORRECTION

PATENT NO. : 7,745,270 B2  Page 1 of 1
APPLICATION NO. : 12/006047
DATED : June 29, 2010
INVENTOR(S) : Uday Shah et al.

It is certified that error appears in the above-identified patent and that said Letters Patent is hereby corrected as shown below:

In the Claims:

In column 5, line 38, in claim 10, delete "ploysilicon" and insert -- polysilicon --, therefor.

In column 5, line 40, in claim 10, delete "ploysilicon" and insert -- polysilicon --, therefor.

In column 5, line 40, in claim 10, delete "ploysilicon" and insert -- polysilicon --, therefor.

In column 5, line 42, in claim 10, delete "ploysilicon" and insert -- polysilicon --, therefor.

In column 5, line 45, in claim 10, delete "ploysilicon" and insert -- polysilicon --, therefor.

In column 6, line 27, in claim 16, delete "ploysilicon" and insert -- polysilicon --, therefor.

In column 6, line 29, in claim 16, delete "ploysilicon" and insert -- polysilicon --, therefor.

In column 6, line 30, in claim 16, delete "ploysilicon" and insert -- polysilicon --, therefor.

In column 6, line 35, in claim 16, delete "ploysilicon" and insert -- polysilicon --, therefor.

Signed and Sealed this

Thirtieth Day of November, 2010

David J. Kappos
*Director of the United States Patent and Trademark Office*